(12) United States Patent
Dunga et al.

(10) Patent No.: US 9,165,656 B2
(45) Date of Patent: Oct. 20, 2015

(54) NON-VOLATILE STORAGE WITH SHARED BIT LINES AND FLAT MEMORY CELLS

(71) Applicant: SANDISK TECHNOLOGIES INC., Plano, TX (US)

(72) Inventors: Mohan V. Dunga, Santa Clara, CA (US); Masaaki Higashitani, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 129 days.

(21) Appl. No.: 13/793,925

(22) Filed: Mar. 11, 2013

(65) Prior Publication Data

US 2014/0254269 A1 Sep. 11, 2014

(51) Int. Cl.
*G11C 16/10* (2006.01)
*G11C 7/12* (2006.01)
*G11C 7/18* (2006.01)
*G11C 16/24* (2006.01)
*G11C 29/02* (2006.01)

(52) U.S. Cl.
CPC *G11C 16/10* (2013.01); *G11C 7/12* (2013.01); *G11C 7/18* (2013.01); *G11C 16/24* (2013.01); *G11C 29/025* (2013.01); *G11C 29/028* (2013.01)

(58) Field of Classification Search
USPC ............... 365/185.11, 185.05, 185.18, 203
See application file for complete search history.

(56) References Cited

U.S. PATENT DOCUMENTS

| 5,936,887 | A | 8/1999 | Choi | |
|---|---|---|---|---|
| 6,028,788 | A | 2/2000 | Choi | |
| 6,072,713 | A | 6/2000 | McKenny | |
| 6,091,633 | A | 7/2000 | Cernea | |
| 6,151,249 | A | 11/2000 | Shirota | |
| 6,480,422 | B1 | 11/2002 | Wong | |
| 6,620,683 | B1 | 9/2003 | Lin | |
| 7,034,360 | B2 * | 4/2006 | Kim et al. | 257/336 |
| 7,169,624 | B2 | 1/2007 | Hsu | |
| 7,237,074 | B2 | 6/2007 | Guterman | |
| 7,244,984 | B2 | 7/2007 | Kamigaichi | |
| 7,259,991 | B2 | 8/2007 | Aritome | |
| 7,411,825 | B2 * | 8/2008 | Kutsukake et al. | 365/185.17 |
| 7,508,714 | B2 | 3/2009 | Fasoli | |
| 7,616,490 | B2 | 11/2009 | Mokhlesi | |
| 8,194,472 | B2 * | 6/2012 | Sato | 365/189.06 |

(Continued)

OTHER PUBLICATIONS

Klein, "Choosing the Right NAND Flash Memory Technology." Micron. Dec. 2010.*

(Continued)

*Primary Examiner* — Huan Hoang
*Assistant Examiner* — Minh Dinh
(74) *Attorney, Agent, or Firm* — Vierra Magen Marcus LLP

(57) ABSTRACT

A non-volatile storage system is disclosed that includes pairs (or another number) of NAND strings (or other groupings of memory cells) in the same block being connected to and sharing a common bit line. By sharing bit lines, less bit lines are needed in the storage system. Using less bit lines reduces the space needed to implement the storage system. Each NAND string will have two drain side select gates. The non-volatile storage system will have two drain side selection lines each connected to one of the two drain side select gates so that the NAND strings sharing a bit line can be individually selected. To allow proper selection of a NAND string using the select gates, the select gates will be subjected to non-volatile programming in order to set the threshold voltage of the select gates to an appropriate level.

23 Claims, 15 Drawing Sheets

(56) References Cited

U.S. PATENT DOCUMENTS

| | | | |
|---|---|---|---|
| 8,335,108 B2* | 12/2012 | Lee et al. | 365/185.17 |
| 2009/0268524 A1 | 10/2009 | Maejima | |
| 2009/0302472 A1 | 12/2009 | Yoon | |
| 2010/0085812 A1 | 4/2010 | Kang | |
| 2011/0199833 A1 | 8/2011 | Shim | |
| 2011/0211392 A1 | 9/2011 | Kim | |
| 2011/0249503 A1 | 10/2011 | Yamada | |
| 2012/0147676 A1 | 6/2012 | Mokhlesi | |
| 2012/0195125 A1* | 8/2012 | Choe et al. | 365/185.15 |
| 2012/0224424 A1 | 9/2012 | Lee | |
| 2013/0128669 A1 | 5/2013 | Mokhlesi | |
| 2013/0248974 A1* | 9/2013 | Alsmeier et al. | 257/321 |

OTHER PUBLICATIONS

U.S. Appl. No. 13/788,183, filed Mar. 7, 2013.
PCT Invitation to Pay Additional Fees, PCT Patent Application No. PCT/US2014/018126.
PCT Annex, Communication Relating to the Results of the Partial International Search, PCT Patent Application No. PCT/US2014/018126.
"A New Shared Bit Line NAND Cell Technology for the 256 Mb Flash Memory with 12V Programming," Shin et al., IEEE, 1996.
U.S. Appl. No. 13/674,470, filed Nov. 12, 2012.
PCT International Search Report dated May 16, 2014, PCT Patent Application No. PCT/US2014/018126.
PCT Written Opinion of the International Searching Authority dated May 16, 2014, PCT Patent Application No. PCT/US2014/018126.
PCT International Search Report dated Sep. 4, 2014, PCT Patent Application No. PCT/US2014/019732.
PCT Written Opinion of the International Searching Authority dated Sep. 4, 2014, PCT Patent Application No. PCT/US2014/019732.
Restriction Requirement dated Nov. 7, 2014 from U.S. Appl. No. 13/788,183, 5 pages.
Response to Restriction Requirement filed Dec. 30, 2014, in U.S. Appl. No. 13/788,183, 7 pages.
Office Action dated Jan. 22, 2015 from U.S. Appl. No. 13/788,183, 36 pages.
Response to Office Action filed Apr. 1, 2015, in U.S. Appl. No. 13/788,183.

* cited by examiner

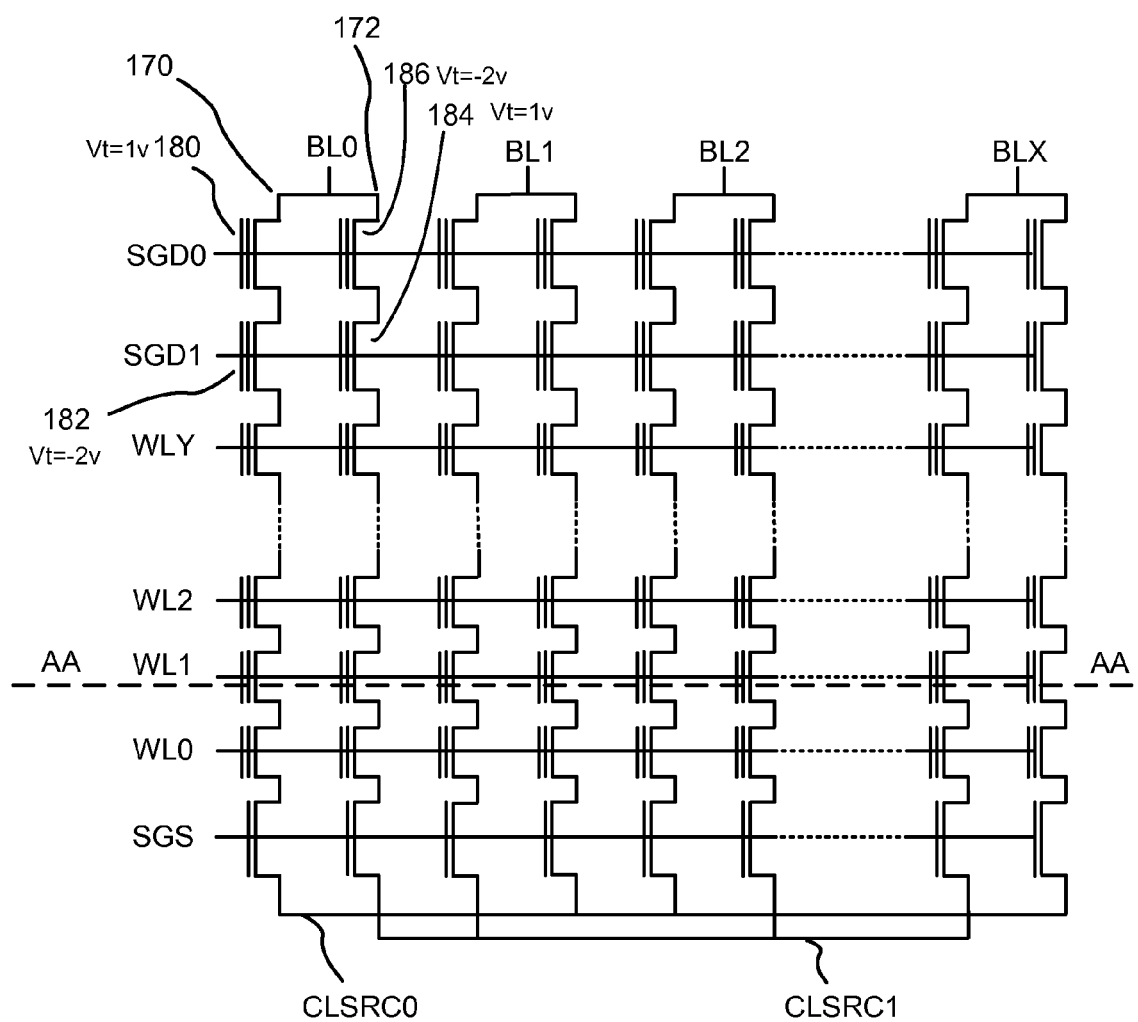

|        | Program | Verify/Read |
|--------|---------|-------------|
| Vbl    | 0v/Vdd  | Vsense      |
| SGDU   | Vpgm    | 1v          |
| SGD0   | Vpass   | Vread       |
| SGD1   | Vpass   | Vread       |
| WL     | Vpass   | Vread       |
| SGS    | 0v      | Vread       |
| CLSRC0 | 1v      | 0v          |
| CLSRC1 | 1v      | 0v          |

Fig. 14A

|        | Program | Verify/Read      |
|--------|---------|------------------|
| Vbl    | Vdd     | Vsense           |
| SGDU   | 0v      | Vread            |
| SGD0   | Vpgm    | 1v               |
| SGD1   | Vpass   | Vread            |
| WL     | Vpass   | Vread            |
| SGS    | Vsgd    | Vread            |
| CLSRC0 | 0v      | 0v               |
| CLSRC1 | Vdd     | float or Vsense  |

Fig. 14B

|        | Program | Verify/Read |
|--------|---------|-------------|
| Vbl    | Vdd     | Vsense      |
| SGDU   | 0v      | Vread       |
| SGD0   | Vpass   | 0v          |
| SGD1   | Vpgm    | 1v          |
| WL     | Vpass   | Vread       |
| SGS    | Vsgd    | Vread       |
| CLSRC0 | Vdd     | 0v          |
| CLSRC1 | 0v      | 0v          |

Fig. 14C

|        | Program | Verify/Read |
|--------|---------|-------------|
| Vbl    | 0/Vdd   | Vsense      |
| SGDU   | Vpass   | Vread       |
| SGD0   | 0v      | 0v          |
| SGD1   | Vpgm    | 1v          |
| WL     | Vpass   | Vread       |
| SGS    | 0v      | Vread       |
| CLSRC0 | 1v      | 0v          |
| CLSRC1 | 1v      | 0v          |

Fig. 14D

|        | Program | Verify/Read  |
|--------|---------|--------------|
| Vbl    | 3v      | Vsense       |
| SGD0   | 5v      | 1v           |
| SGD1   | Vpass   | Vread        |
| WL     | Vpass   | Vread        |
| SGS    | Vpass   | Vread        |
| CLSRC0 | 0v      | 0v           |
| CLSRC1 | Float   | Float/Vsense |

Fig. 15A

|        | Program | Verify/Read  |
|--------|---------|--------------|
| Vbl    | 0v      | Vsense       |
| SGD0   | 8v      | 1v           |
| SGD1   | Vpass   | Vread        |
| WL     | Vpass   | Vread        |
| SGS    | Vpass   | Vread        |
| CLSRC0 | 5v      | 0v           |
| CLSRC1 | Float   | Float/Vsense |

Fig. 15B

|        | Program | Verify/Read |
|--------|---------|-------------|
| Vbl    | Vdd     | Vsense      |
| SGD0   | 0v      | 0v          |
| SGD1   | Vpgm    | 1v          |
| WL     | Vpass   | Vread       |
| SGS    | Vsgd    | Vread       |
| CLSRC0 | Vdd     | 0v          |
| CLSRC1 | 0v      | 0v          |

Fig. 15C

|        | Program | Verify/Read  |
|--------|---------|--------------|
| Vbl    | 0v/Vdd  | Vsense       |
| SGD0   | Vsgd    | 0v           |
| SGD1   | Vpgm    | 1v           |
| WL     | Vpass   | Vread        |
| SGS    | 0v      | Vread        |
| CLSRC0 | 1v      | Float/Vsense |
| CLSRC1 | 1v      | 0v           |

Fig. 15D

```
program all select gates connected to SGDO
         to Vt ≥ 1v                          — 602
                    ↓
erase select gates connected to SGDO on
NAND strings connected to CLSRC0 using      — 604
              GIDL erase
```

|        | Erase | Verify/Read  |
|--------|-------|--------------|
| Vbl    | 0v    | Vsense       |
| SGD0   | -2v   | 0v           |
| SGD1   | Vpgm  | Vread        |
| WL     | Vpass | Vread        |
| SGS    | Vsgd  | Vread        |
| CLSRC0 | 0v    | 0v           |
| CLSRC1 | Vdd   | Float/Vsense |

Fig. 17

|  | Program | Verify/Read |
|---|---|---|
| Vbl | 0v | Vsense |
| SGD0 | Vsgd | Vsg |
| SGD1 | 0v | 0v |
| WLn | Vpgm | Vcg |
| WLunselected | Vpass | Vread |
| SGS | 0v | Vsg |
| CLSRC0 | 1v | 0v |
| CLSRC1 | iv | 0v |
| SGDU | Vpass | Vread |

Fig. 18

|  | Program | Verify/Read |
|---|---|---|
| Vbl | 0v | Vsense |
| SGD0 | 0v | 0v |
| SGD1 | Vsgd | Vsg |
| WLn | Vpgm | Vcg |
| WLunselected | Vpass | Vread |
| SGS | 0v | Vsg |
| CLSRC0 | 0v | 0v |
| CLSRC1 | 1v | 0v |
| SGDU | Vpass | Vread |

# NON-VOLATILE STORAGE WITH SHARED BIT LINES AND FLAT MEMORY CELLS

BACKGROUND OF THE INVENTION

1. Field

The present invention relates to non-volatile storage.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state. More information about programming can be found in U.S. Pat. No. 6,859,397, titled "Source Side Self Boosting Technique For Non-Volatile Memory;" and in U.S. Pat. No. 6,917,542, titled "Detecting Over Programmed Memory," both patents are incorporated herein by reference in their entirety.

Some EEPROM and flash memory devices have a floating gate that is used to store two ranges of charges. Therefore, the memory cell can be programmed/erased between two states: an erased state and a programmed state that correspond to data "1" and data "0." Such a device is referred to as a binary device.

A multi-state flash memory cell is implemented by identifying multiple, distinct allowed threshold voltage ranges for programmed memory cells. Each distinct threshold voltage range corresponds to a predetermined value for the set of data bits. The specific relationship between the data programmed into the memory cell and the threshold voltage ranges of the memory cell depends upon the data encoding scheme adopted for the memory cells. For example, U.S. Pat. No. 6,222,762 and U.S. Pat. No. 7,237,074, both of which are incorporated herein by reference in their entirety, describe various data encoding schemes for multi-state flash memory cells.

To increase the capacity of non-volatile storage systems and/or reduce the size of the systems, there has been a trend to shrink the area used to implement the memory structure. However, as process geometries shrink, many design and process challenges are presented

BRIEF DESCRIPTION OF THE DRAWINGS

FIG. 4 is a block diagram depicting one embodiment of a block in a memory array according to the technology described herein.

FIG. 14A is a table indicating voltages used to program dummy select gates.

FIG. 14B is a table indicating voltages used to program select gates when the memory system includes dummy select gates.

FIG. 14C is a table indicating voltages used to program select gates when the memory system includes dummy select gates.

FIG. 14D is a table indicating voltages used to program select gates when the memory system includes dummy select gates.

FIG. 15A is a table indicating voltages used to program select gates.

FIG. 15B is a table indicating voltages used to program select gates.

FIG. 15C is a table indicating voltages used to program select gates.

FIG. 15D is a table indicating voltages used to program select gates.

FIG. 17 is a table indicating voltages used to program and verify/read data non-volatile storage elements.

FIG. 18 is a table indicating voltages used to program and verify/read data non-volatile storage elements.

DETAILED DESCRIPTION

A non-volatile storage system is disclosed that includes pairs (or another number) of NAND strings (or other groupings of memory cells) in the same block being connected to and sharing a common bit line. By sharing bit lines, less bit lines are needed in the storage system. Using less bit lines reduces the space needed to implement the storage system. Each NAND string will have two (or more) drain side select gates. The non-volatile storage system will have two (or more) drain side selection lines each connected to one of the two drain side select gates so that the NAND strings (or other groupings of memory cells) sharing a bit line can be individually selected at the block level. To allow proper selection of a NAND string using the select gates, the select gates will be subjected to non-volatile programming in order to set the threshold voltage of the select gates to an appropriate level. More details are discussed below.

Figure 1:
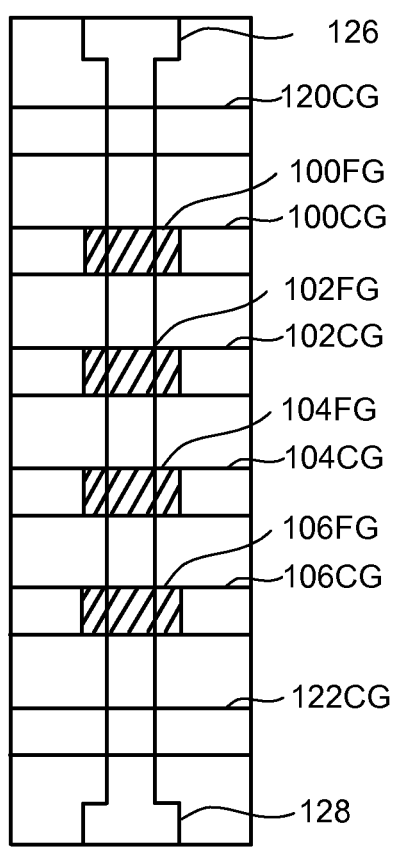
FIG. 1 is a top view of a prior art NAND string.
Figure 2:
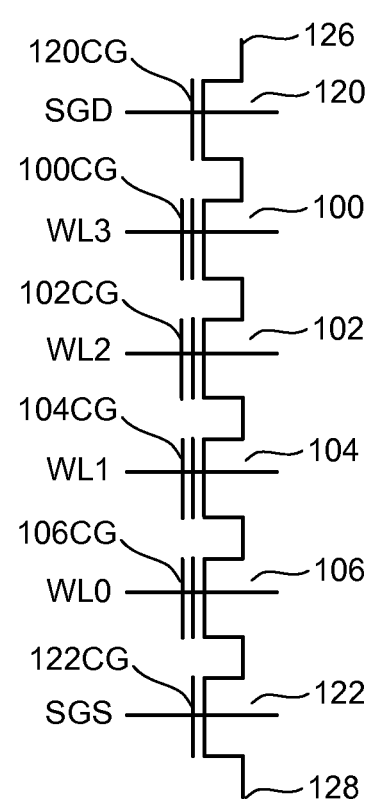
FIG. 2 is an equivalent circuit diagram of the prior art NAND string.

One example (but not the only example) of a non-volatile storage system that can be used to implement the technology described herein is a flash memory system that uses the NAND structure, which includes arranging multiple transistors in series (ie connected), sandwiched between two select gates. The transistors in series (data non-volatile storage elements) and the select gates are referred to as a NAND string. FIG. 1 is a top view showing one prior art NAND string. FIG. 2 is an equivalent circuit thereof. The NAND string depicted in FIGS. 1 and 2 includes four transistors 100, 102, 104 and 106 in series and sandwiched between a first (drain side) select gate 120 and a second (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is typically connected to the common source line by its source select gate controlled by select line SGS and connected to its associated bit line by its drain select gate controlled by select line SGD. The use of the terms connect, connected, and connection in this document can include a direct connection or an indirect connection. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Relevant examples of NAND type flash memories and their operation are provided in the following U.S. patents/patent applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348. Other types of non-volatile storage devices, in addition to NAND flash memory, can also be used.

Figure 3:
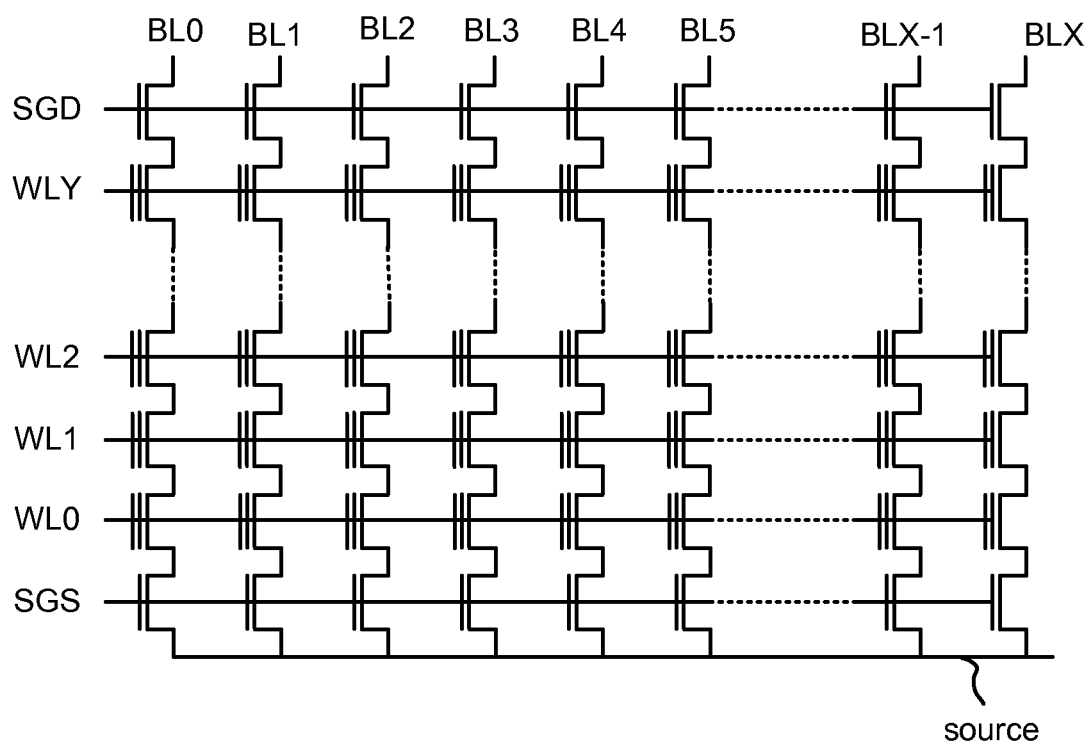
FIG. 3 is a block diagram depicting one embodiment of a block in a prior art memory array.

FIG. 3 provides one example of a block of memory cells implemented in prior art memory systems. As can be seen, each NAND string includes many memory cells. For example FIG. 3 shows each NAND string including Y memory cells. Each NAND string is connected to one bit line, has one drain side selection signal SGD, has one drain side select gate connected to the drain side selection signal SGD, one source side selection signal SGS, and one source side select gate connected to the source side selection signal SGS. All of the NAND strings depicted in FIG. 3 are connected to a common source line labeled as "source."

In order to save space on the semiconductor die, it is proposed that two NAND strings (or other grouping of memory cells) share a single (common) bit line. One proposal for having two NAND strings share a bit line includes using two select gates at the drain side (same side/end) of each NAND string in order to connect or disconnect a NAND string from the shared bit line. For example, FIG. 4 depicts a block in a memory array comprising NAND strings each having two select gates at the drain side (same side/end) of each NAND string in order to connect or disconnect a NAND string from the shared bit line.

FIG. 4 shows a block of non-volatile storage elements, including multiple groups of nonvolatile storage elements that each comprise multiple connected data nonvolatile storage elements and multiple select gates on a common side of the data nonvolatile storage elements. In one embodiment, the groups of nonvolatile storage elements are NAND strings.

FIG. 4 shows a block with X bit lines. Each bit line is connected to two NAND strings. In other embodiments, a bit line can be connected to more than two NAND strings. In the embodiment of FIG. 4, each NAND string includes a set of data nonvolatile storage elements connected to word lines WL0, WL1, . . . , WLY and a set of select gates. FIG. 4 shows, for each NAND string, one select gate on the source side of the data nonvolatile storage elements connected to selection signal SGS. FIG. 4 shows each NAND string having two select gates on the drain side of the data nonvolatile storage elements, with half of the drain side select gates connected to selection signal SGD0 and half of the drain side select gates connected to selection line SGD1. In other embodiments, there can be more than two drain side select gates per NAND string. In one embodiment, the transistors comprising the select gates are wider than the transistors comprising the data nonvolatile storage elements.

In one embodiment, bit lines are connected to sense amplifiers which are used to sense the state of one or more non-volatile storage elements connected to NAND strings during a read and/or verify operation. In the embodiment of FIG. 4, multiple source lines are used such that the NAND strings connected to a common shared bit line will be connected to different source lines. In the example of FIG. 4, two source lines are used: CLSRC0 and CLSRC1. Each pair of NAND strings connected to a common shared bit line will have one NAND string connected to CLSRC0 and the other NAND string connected to CLSRC1. In one embodiment, when programming the select gates, at least one of the select gates for each group/NAND string is provided charge for the programming operation from the source line (which is on the opposite side of the NAND string as the shared common bit line).

As described above, each NAND string includes two select gates on the drain side of the data nonvolatile storage elements. For example, bit line BL0 is connected to NAND string 170 and NAND string 172. NAND string 170 has select gates 180 and 182 on the drain side of the data nonvolatile storage elements connected to WL0, WL1, . . . WLY. Select gate 180 is connected to selection line SGD0 and bit line BL0. Select gate 182 is connected to selection line SGD1, select gate 180 and the data nonvolatile storage element connected to word line WLY. NAND string 172 includes two select gates 184 and 186 on the drain side of the data nonvolatile storage elements. Select gate 186 is connected to selection line SGD0 and bit line BL0. Select gate 184 is connected to selection line SGD1, select gate 186 and the data nonvolatile storage element connected to word line WLY.

In one embodiment, select gates 180, 182, 184 and 186 are used in order to select one of NAND strings 170 and 172 to be connected to the common shared bit line BL0. One of the means for accomplishing this is for the select gates 180, 182, 184 and 186 to be implemented with the same structure as flash memory nonvolatile storage elements with floating gates and/or charge trap material stacks, as discussed above and known in the art. In this manner, the threshold voltages of the four select gates 180, 182, 184 and 186 can be set so that by appropriately biasing SGD0 and SGD1 the system can select one of NAND strings 170 and 172. In one embodiment, the threshold voltage of select gate 180 will be set to approximately 1 volt, the threshold voltage of select gate 182 will be set to approximately −2 volts, the threshold voltage of select gate 184 will be set to approximately 1 volt and a threshold voltage of select gate 186 will be set to approximately −2 volts. In this manner, NAND string 170 can be selected for electrical connection to bit line BL0 by driving 3 (or more) volts on SGD0 and 0 volts on SGD1. By asserting 3 (or more) volts on SGD0, select gate 180 and select gate 186 will both turn on. By driving 0 volts on SGD1, select gate 182 will turn on but select gate 184 will not turn on; therefore, NAND string 172 will be cut off from bit line BL0, while NAND string 170 is in electrical communication with bit line BL0.

Figure 4A:
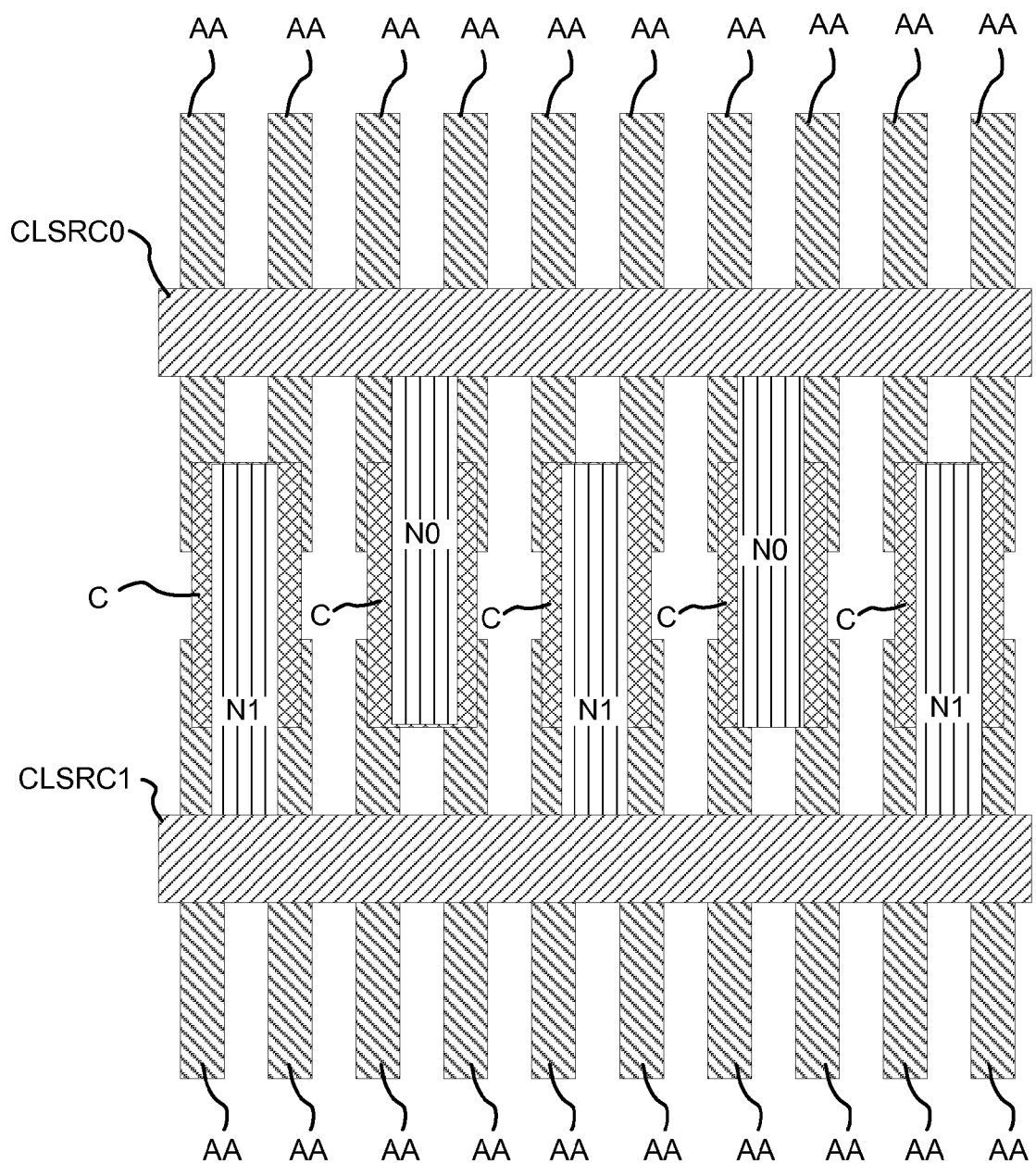
FIG. 4A depicts a layout of a portion of a memory array according to the embodiment of FIG. 4.

FIG. 4A shows a layout of a portion of a memory array according to the embodiment of FIG. 4. The portion of the memory array depicted in FIG. 4A corresponds to portions of two adjacent blocks, showing the connections of NAND strings to CLSRC0 and CLSRC1. FIG. 4A shows active areas AA, that correspond to the NAND strings. Above and perpendicular to the active areas AA are CLSRC0 and CLSRC1. A set of connectors C connect four active areas AA (and, therefore, four NAND strings) such that two adjacent active areas AA on the top block and two adjacent active areas AA on the adjacent bottom block are connected. Every other connector C (and, therefore, every other connected groups of four active areas) is connected to CLSRC0, with the intervening connectors C (and, therefore, intervening connected groups of four active areas) connected to CLSRC1.

Figure 5:
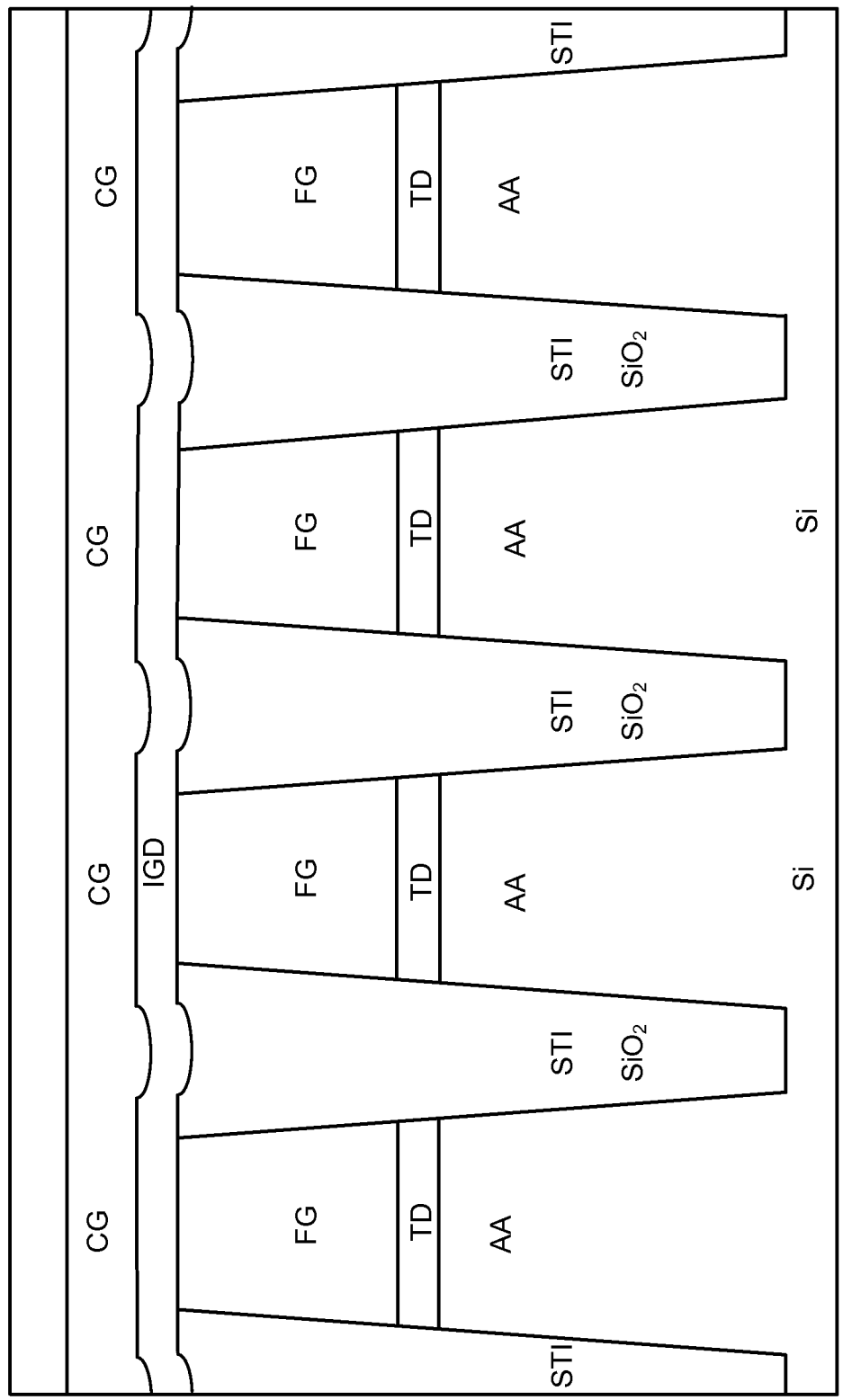
FIG. 5 depicts a cross section of FIG. 4, along the line marked AA.

In one embodiment, the transistors used on the NAND strings of FIG. 4 have a somewhat flat profiles. That is, in some prior art systems, the transistors of the NAND string are implemented such that the control gate will wrap around the floating gate. In another embodiment, the control gate is somewhat flat and does not wrap around the floating gate. FIG. 5 depicts a cross section, along dashed line AA of FIG. 4, of the transistors of a set of NAND strings. That is, FIG. 5 shows a cross section across multiple NAND strings. FIG. 5 shows the silicon substrate (Si) for which the NAND strings are positioned. Each of the NAND strings is built on an active area (AA) of the silicon substrate. Between active areas are shallow trench isolation areas (STI), which are filled with $SiO_2$. The top portion of the active areas (AA) function as the channels of the NAND strings and the individual transistors. On top of the active areas (AA) are tunnel dielectric regions (TD), which may be formed of $SiO_2$ or another substance.

Above the tunnel dielectric (TD) is the floating gate (FG). In one embodiment, the floating gate is a single layer of polysilicon. In another embodiment, the floating gate can be multiple layers. For example, the floating gate can include four layers: a lower layer of polysilicon, a second layer that comprises a dielectric (e.g., $SiO_2$), a third layer serving as a charge trap layer (e.g., $HfO_2$), and a top layer of dielectric material (e.g., $SiO_2$). Above the floating gates (FG), is the word line which serves as the control gate (CG). There is an inter-gate dielectric layer IGD (e.g. SiO2, ONO) between the FG and CG. The profile of the control gate (CG) is relatively flat. It can be noticed from FIG. 5 that above the shallow trench isolation regions (STI), there is a small dip in the bottom of the control gate. However, this dip is much smaller than prior art control gates.

Figure 6:
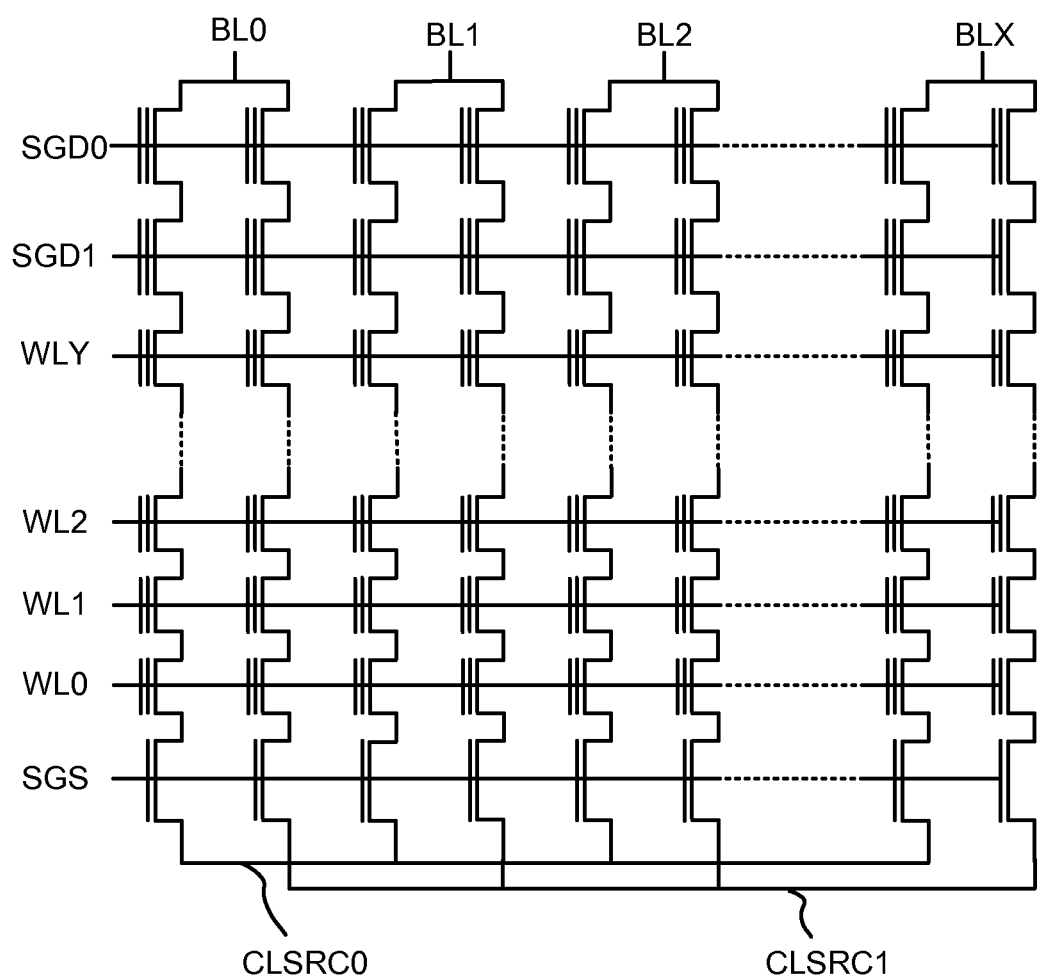
FIG. 6 is a block diagram depicting one embodiment of a block in a memory array according to the technology described herein.

FIG. 6 is another embodiment of a block of non-volatile storage elements, including multiple groups of nonvolatile storage elements that each comprise multiple connected data nonvolatile storage elements and multiple select gates on a common side (e.g., drain side) of the data nonvolatile storage elements. In one embodiment, the groups of nonvolatile storage elements are NAND strings. FIG. 6 is an alternative to the embodiment of FIG. 4 and differs from the embodiment in FIG. 4 based on the connection to the two source lines (CLSRC0 and CLSRC1). For example, FIG. 4 shows adjacent NAND strings for different bit lines connected to the same source line, while FIG. 6 shows adjacent NAND strings connected to different source lines.

Figure 6A:
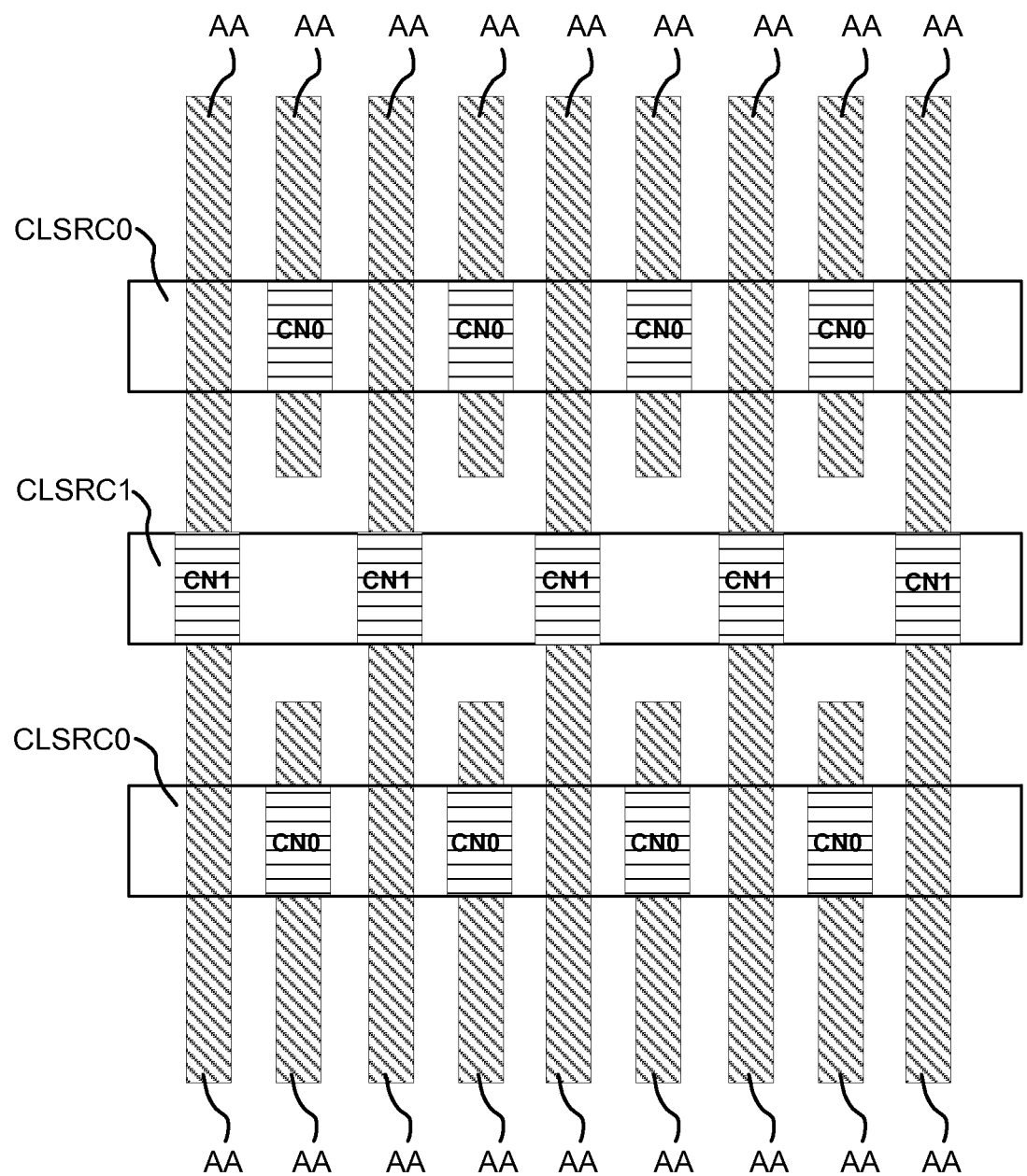
FIG. 6A depicts a layout of a portion of a memory array according to the embodiment of FIG. 6.

FIG. 6A shows a layout of a portion of a memory array according to the embodiment of FIG. 6. The portion of the memory array depicted in FIG. 6A corresponds to portions of two adjacent blocks, showing the connections of NAND strings to CLSRC0 and CLSRC1. FIG. 6A shows active areas AA, that correspond to the NAND strings. Above and perpendicular to the active areas AA are CLSRC0 and CLSRC1. Note that CLSRC1 is shared by two adjacent blocks, while each block has its own CLSRC0. A set of connectors CN0 connect active areas AA (and, therefore, NAND strings) to CLSRC0. A set of connectors CN1 connect active areas AA (and, therefore, NAND strings) to CLSRC1. Therefore, every other active area AA (and every other NAND string) is connected to a corresponding active area AA (and corresponding NAND string) in a neighboring block of non-volatile storage elements and to CLSRC1, with intervening active areas (and NAND strings) connected to CLSRC0.

Figure 7:
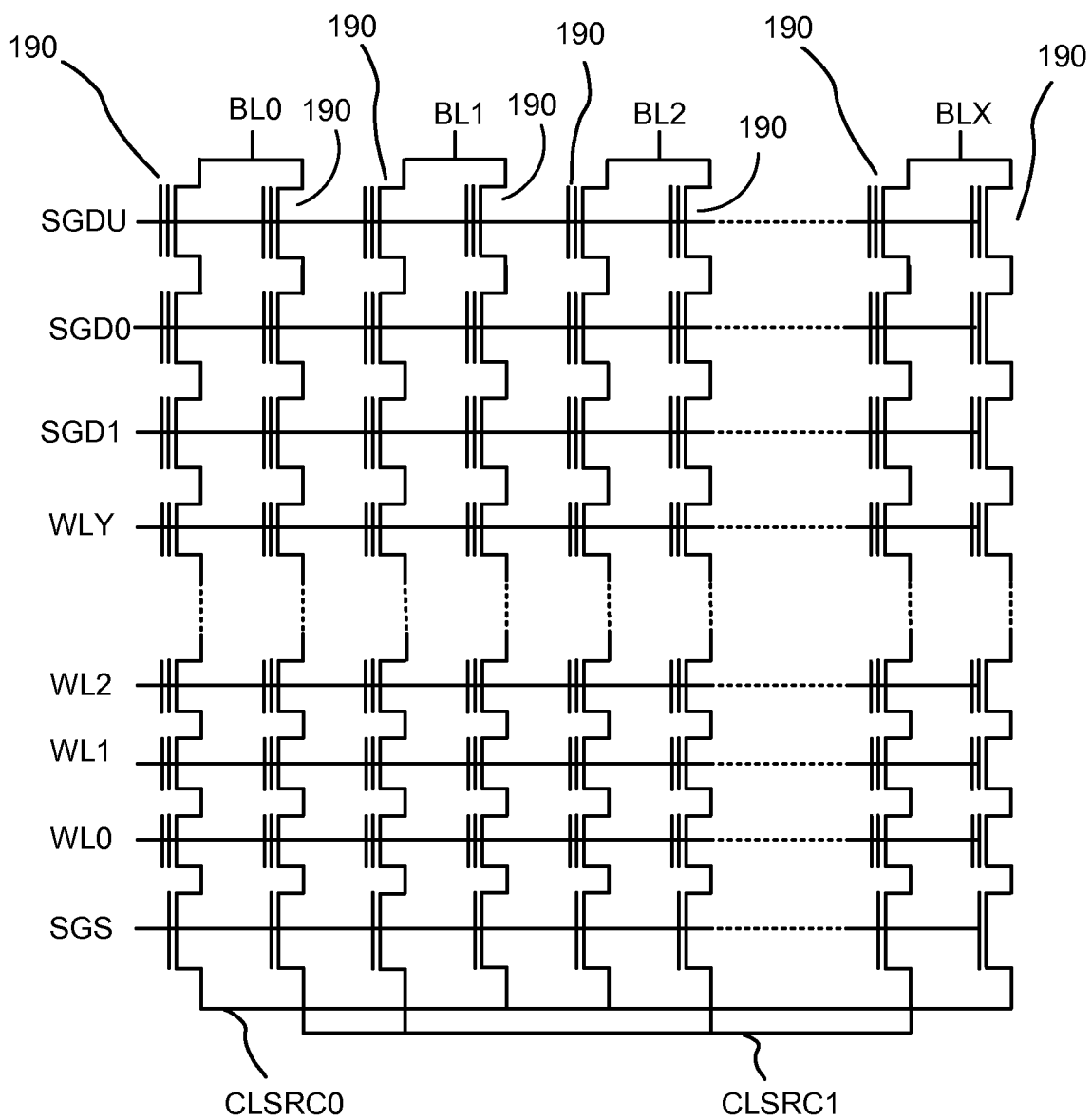
FIG. 7 is a block diagram depicting one embodiment of a block in a memory array according to the technology described herein.

FIG. 7 is another embodiment of a block of non-volatile storage elements, including multiple groups of nonvolatile storage elements that each comprise multiple connected data nonvolatile storage elements and multiple select gates on a common side (e.g., drain side) of the data nonvolatile storage elements. In one embodiment, the groups of nonvolatile storage elements are NAND strings. FIG. 7 shows connection to the two source lines CLSRC0 and CLSRC1 in the same manner as FIG. 4. However, each NAND string of FIG. 7 also include a dummy select gate 190 connected to dummy selection line SGDU. The dummy select gates positioned between and connected to the respective bit lines and the select gates connected to SGD0. As will be explained below, the dummy select gates 190 allow the associated bit lines to be cut off, which aids in programming the select gates connected to SGD0.

Figure 8:
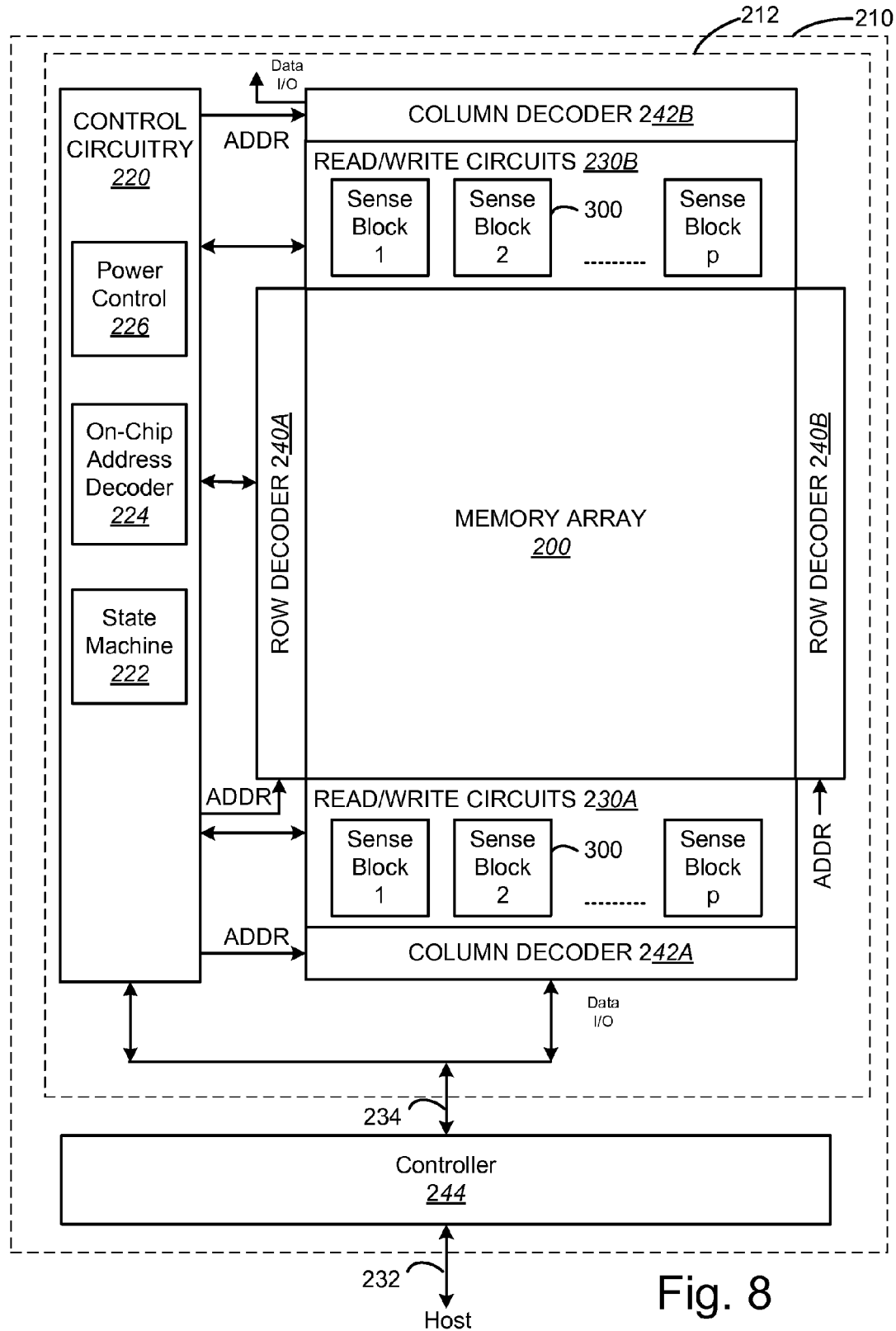
FIG. 8 is a block diagram of a non-volatile memory system.

FIG. 8 illustrates a memory device 210 having read/write circuits for reading and programming a page (or other unit) of memory cells (e.g., NAND multi-state flash memory) in parallel, including read and programming select gates as described herein. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. Word lines and bit lines are examples of control lines. In a typical embodiment, a Controller 244 is included in the same memory device 210 (e.g., a removable storage card or package) as the one or more memory die 212. Commands and data are transferred between the host and Controller 244 via lines 232 and between the Controller 244 and the one or more memory die 212 via lines 234. In one embodiment, Controller 244 include a data storage (Controller memory), a memory interface for interfacing with the memory chip/die and one or more processes in communication with the data storage and memory interface.

Control circuitry 220 cooperates with the read/write circuits 230A and 230B to perform memory operations on the memory array 200. The control circuitry 220 includes a state machine 222, an on-chip address decoder 224, and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. Control circuitry 220 provides address lines ADDR to row decoders 240A and 204B, as well as column decoders 242A and 242B. Column decoders 242A and 242B provide data to controller 244 via the signal lines marked Data I/O.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits. The one or more managing circuits perform the processes described herein, including reading and programming memory cells and select gates.

In one embodiment, an array of memory cells 200 is divided into a large number of blocks (e.g., blocks 0-1023, or another amount) of memory cells. As is common for flash memory systems, the block is the unit of erase. That is, each block contains the minimum number of memory cells that are erased together. Other units of erase can also be used. A block contains a set of NAND strings which are accessed via bit lines and word lines. Typically, all of the NAND strings in a block share a common set of word lines.

Each block is typically divided into a number of pages. In one embodiment, a page is a unit of programming. Other units of programming can also be used. One or more pages of data are typically stored in one row of memory cells. For example, one or more pages of data may be stored in memory cells connected to a common word line. Thus, in one embodiment, the set of memory cells that are connected to a common word line are programmed simultaneously. A page can store one or more sectors. A sector includes user data and overhead data (also called system data). Overhead data typically includes header information and Error Correction Codes (ECC) that have been calculated from the user data of the sector. Controller 244 (or other component) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used.

Figure 9:
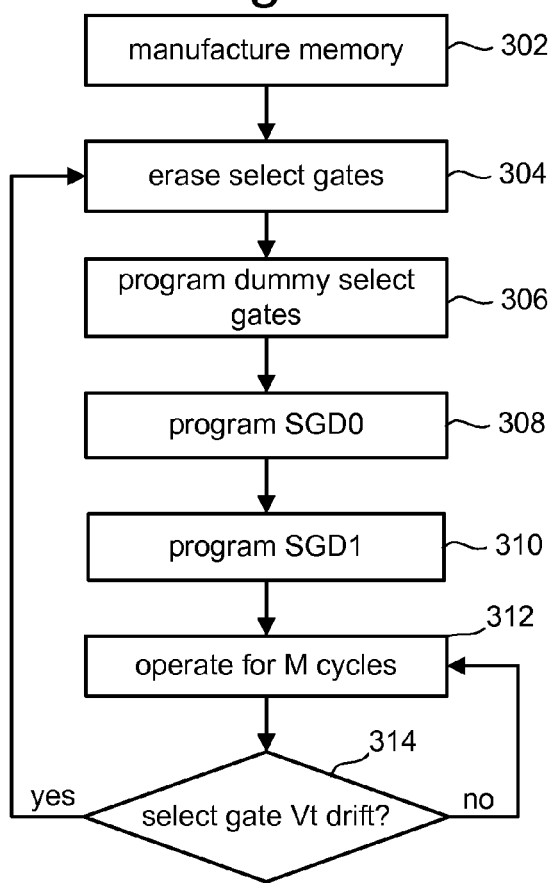
FIG. 9 is a flow chart describing one embodiment of a process for using a non-volatile memory system.

FIG. 9 is a flow chart describing one embodiment of a process for making and using non-volatile memory. In step 302 of FIG. 9, the memory system is manufactured using processes known in the art. As discussed above, in order to be able to use selection lines SGD0 and SGD1 to independently select one of the multiple NAND strings connected to a common shared bit line, it is needed (in one embodiment) to perform non-volatile programming of at least one of the drain side select gates of each NAND string in order to allow independent selection of that NAND string. That is, a subset of the select gates connected to SGD0 must be programmed using non-volatile programming and a subset of select gates connected to selection line SGD1 must be programmed using non-volatile programming. In one embodiment, before programming any of the select gates, all of the select gates are erased in step 304 using processes known in the art for erasing non-volatile storage elements. In one embodiment, the select gates are erased such that there threshold voltage are set to approximately −2 volts. As discussed above, one embodiment includes using dummy select gates connected to a dummy selection line (see FIG. 7). In those embodiments with dummy select gates, one or more of the dummy select gates may need to be programmed in step 306. In those embodiments that do not use dummy select gates, step 306 will be omitted. In one embodiment, the select gates that are programmed have their threshold voltage set at approximately 1 volt. More information about performing step 306 will be provided below.

In step 308, at least a subset of select gates connected to selection line SGD0 will be programmed. In one embodiment, the select gates that are programmed have their threshold voltage set at approximately 1 volt. More information about step 308 will be provided below. In step 310, at least a subset of select gates connected to selection line SGD1 will be programmed. In one embodiment, the select gates that are programmed have their threshold voltage set at approximately 1 volt. More information about performing step 310 will be provided below. Thus, steps 308 and 310 include performing non-volatile programming on at least one of the select gates for each group/NAND string to allow independent selection of the group/NAND string from other groups/NAND strings connected to a common shared bit line. In step 310, the memory system will be operated for M cycles, where M is an integer. Each cycle includes programming data non-volatile storage elements and erasing those data non-volatile storage elements. The variable M can be set based on simulation. For example, M could be equal to 100 cycles, 1,000 cycles, 10,000 cycles, etc. In other embodiments, rather than operating for M cycles, step 310 can include operating for a particular period of time. In step 314, the system tests whether the threshold voltage of the select gates that were programmed in steps 308 and 310 have drifted by an amount such that they no longer function properly to select a single NAND string connected to a bit line. If not, then the system will operate for another M cycles (step 312) and then test again in step 314. If the threshold voltage of the select gates that were programmed in steps 308 and 310 have drifted by an amount that causes an error or other problem, the process will loop back to step 308 in order to erase the select gates and re-program according to the flow chart of FIG. 9. As can be seen, the process of FIG. 9 includes programming the select gates and then operating for a certain period of time or a certain set of cycles, before adjusting the programming, if necessary.

Figure 10:
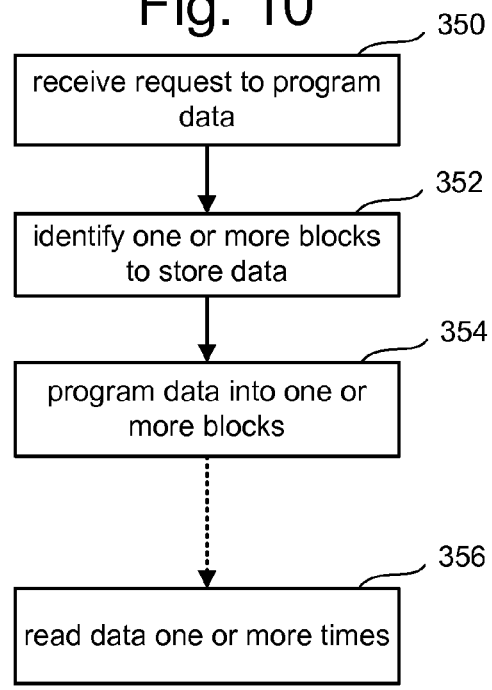
FIG. 10 is a flow chart describing one embodiment of a process for operating non-volatile memory.

FIG. 10 is a flow chart describing one embodiment of a process for operating non-volatile memory, such as the system of FIG. 8 (or other systems). In one embodiment, the process of FIG. 10 is performed as part of step 312 of FIG. 9. In step 350, a request to program data is received. The request can be from a host, another device or the controller. The request can be received at the controller, control circuitry, state machine, or other device. In response to the request, the controller, control circuitry, state machine, or other device, in step 352, will determine which block of flash memory cells will be used to store the data. In step 354, the data will be programmed into the determined block by performing any appropriate programming process that uses the select gates described above, some of which have been subjected to the non-volatile programming described herein. The programmed data will be read one or many times in step 356. The read process will also operate the select gates described above, some of which have been subjected to the non-volatile programming described herein. There is a dashed line between steps 354 and 356 because an unpredictable amount of time may pass between the steps, and step 356 is not performed in response to step 354. Rather, step 356 is performed in response to a request to read the data or other event.

Figure 11:
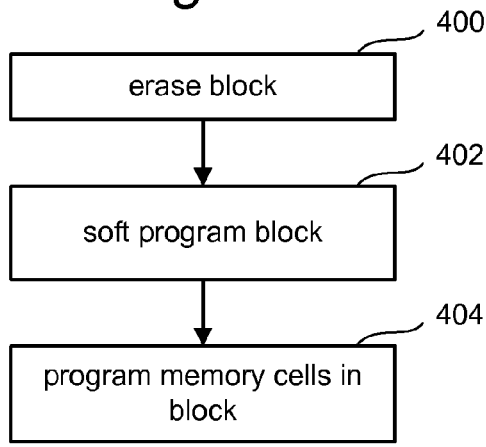
FIG. 11 is a flow chart describing one embodiment of a process for programming a non-volatile memory system.

FIG. 11 is a flow chart describing a programming process for programming memory cells in a block. FIG. 11 is one embodiment of step 354 of FIG. 10. In step 400, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. A strong electric field is, thus, applied to the tunnel oxide layers of selected memory cells and the selected memory cells are erased as electrons of the floating gates are emitted to the substrate side, typically by a Fowler-Nordheim tunneling mechanism. As electrons are transferred from the floating gate to the p-well region, the threshold voltage of the selected memory cells are lowered. Erasing can be performed on the entire memory array, on individual blocks, or another unit of cells. Other techniques for erasing can also be used. In step 402, soft programming is (optionally) performed to narrow the threshold voltage distribution of the erased memory cells. Some memory cells may be in a deeper erased state than necessary as a result of the erase process. Soft programming can apply programming pulses to move the threshold voltage of the deeper erased memory cells to a higher threshold voltage that is still in a valid range for the erased state. In step 404, the memory cells of the block are programmed as described herein. In one embodiment, step 404 includes programming memory cells connected to many or all word lines for a block.

The process of FIG. 11 can be performed at the direction of the State Machine 222, Controller 244 or combination of State Machine 222 and Controller 244, using the various circuits described above. For example, the controller may issue commands and data to the state machine to program the data. In response, the state machine may operate the circuits described above to carrier out the programming operations.

The embodiment of FIG. 9 discussed above includes programming the select gates before operation, and then adjusting the select gates (if necessary) during operation. Another embodiment includes programming the select gates every time, or a subset of times, that the system performs an erase operation.

Figure 12:
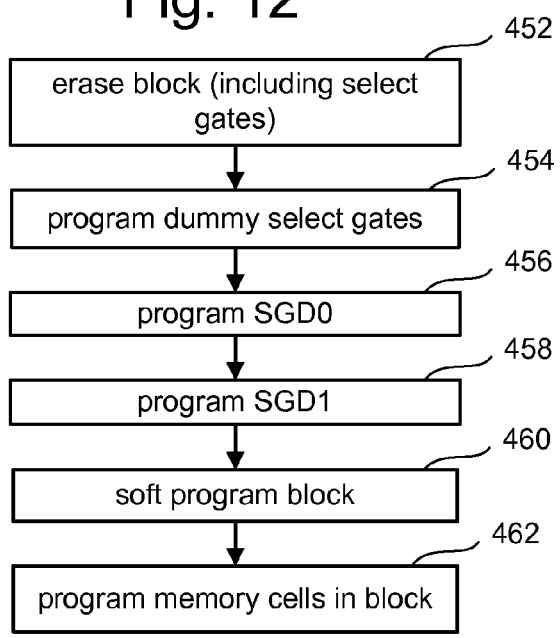
FIG. 12 is a flow chart describing one embodiment of a process for programming non-volatile memory.

Another embodiment includes programming the select gates as part of a programming process for data non-volatile storage elements. FIG. 12 is a flow chart describing another embodiment for programming non-volatile memory. FIG. 12 is an alternative method as compared to FIG. 11 and implements an embodiment where the select gates are programmed every time (or a subset of times) when there is a data programming operation being performed). The process of FIG. 12 is another embodiment of step 354 of FIG. 10. Additionally, the process of FIG. 12 can be performed at the direction of the state machine 222, controller 244 or a combination of the state machine 222 and controller 244, using the various circuits described above. For example, the controller may issue commands and data to the state machine to program the data. In response the state machine may operate the circuits described above to carrier out the programming operations.

In step 452 of FIG. 12, the system will erase the entire block chosen for programming. Step 452 includes also erasing the select gates. For example, the select gates may be erased to have a threshold voltage of −2 volts (or other suitable threshold voltage). In step 454, dummy select gates are programmed (if the embodiment includes dummy select gates). For those embodiments that do not include dummy select gates, step 454 will be omitted. In step 456, a subset of select gates connected to SGD0 will be programmed, as discussed herein. In step 458, a subset of select gates connected to SGD1 will be programmed as discussed herein. That is, steps 456 and 458 include performing non-volatile programming for at least one of the select gates for each group/NAND string to allow independent selection of the group/NAND string from another group/NAND string connected to a common shared bit line. In one embodiment, the select gates that are programmed have their threshold voltage set at approximately 1 volt. In step 460, the block performs soft programming, as discussed above. In step 462, the data non-volatile storage elements in the block are programmed as per the data from the host.

Figure 13:
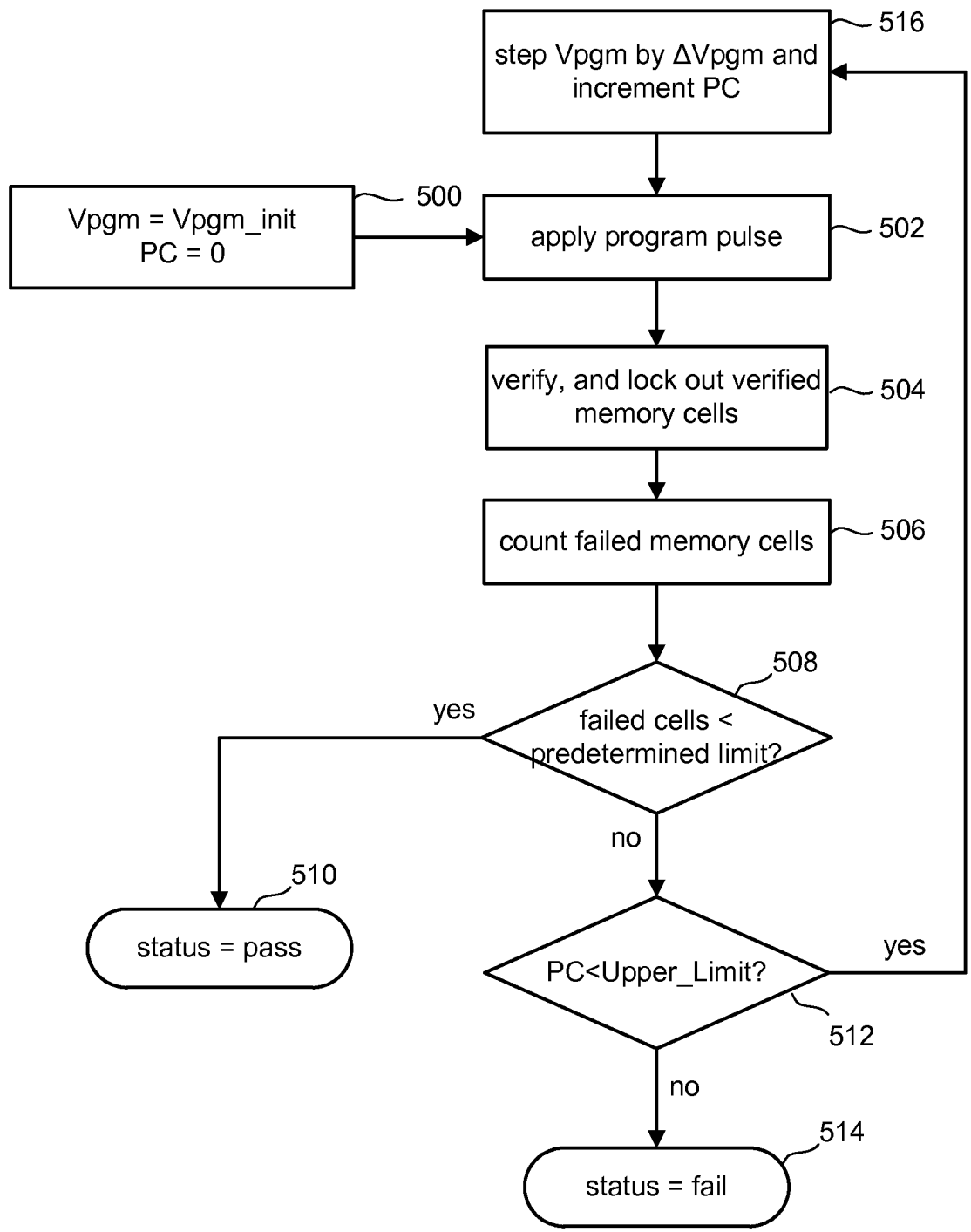
FIG. 13 is a flow chart describing one embodiment of a process for programming memory cells connected to a common word line.

FIG. 13 is a flow chart describing one embodiment of a process for performing programming on one or more memory cells connected to a common word line. Therefore, when programming a block of memory cells the process of FIG. 13 can be performed one or more times for each word line of the block. The process of FIG. 13 can be performed one or multiple times during step 404 of FIG. 11 or step 462 of FIG. 12. The process of FIG. 13 can also be used to program the select gates Therefore, FIG. 13 depicts one example implementation of step 306, 308 and 310 of FIG. 9, as well as steps 454, 456 and 458 of FIG. 12.

In step 500 of FIG. 13, the programming voltage (Vpgm) is initialized to the magnitude (e.g., −12-16V or another suitable level) of the initial programming pulse, as determined and instructed by the Controller. In other embodiments, the State Machine or other component can determine the magnitude of the initial programming pulse. In addition, step 500 includes initializing a program counter PC maintained by state machine 222 to 0.

Typically, the program voltage applied to the control gate during a program operation is applied as a series of program pulses. Between programming pulses are a set of one or more verify pulses to perform verification. In many implementations, the magnitude of the program pulses is increased with each successive pulse by a predetermined step size, referred to as ΔVpgm. In step 502 of FIG. 13, a program pulse of the program signal Vpgm is applied to the selected word line (the word line selected for programming). In one embodiment, the memory cells being programmed are all connected to the same word line (the selected word line). The unselected word lines receive one or more boosting voltages (e.g., ~9 volts) to perform boosting schemes known in the art in order to avoid program disturb. There are many different boosting schemes that can be used with the technology described herein. In one embodiment, if a memory cell should be programmed, then the corresponding bit line is grounded. On the other hand, if the memory cell should remain at its current threshold voltage, then the corresponding bit line is connected to Vdd to inhibit programming. In step 502, the program pulse is concurrently applied to all memory cells connected to the selected word line so that all of the memory cells connected to the selected word line that should be programmed are programmed concurrently. That is, they are programmed at the same time (or during overlapping times). In this manner all of the memory cells connected to the selected word line will concurrently have their threshold voltage change, unless they have been locked out from programming.

In step 504, the appropriate memory cells are verified using the appropriate set of target levels to perform one or more verify operations. If a memory cell is verified to have reached its target, it is locked out from further programming. One embodiment for locking out a memory cell from further programming is to raise the corresponding bit line voltage to, for example, Vdd.

In step 506, the system counts the number of memory cells that have not yet reached their respective target threshold voltage distribution. That is, the system counts the number of memory cells that have failed the verify process. This counting can be done by the state machine, the controller, or other logic. In one implementation, each of the sense blocks 300 (see FIG. 8) will store the status (pass/fail) of their respective memory cells. These values can be counted using a digital counter. As described above, many of the sense blocks have an output signal that is wire-Or'd together. Thus, checking one line can indicate that no cells of a large group of cells have failed verify. By appropriately organizing the lines being wired-Or together (e.g., a binary tree-like structure), a binary search method can be used to determine the number of cells that have failed. In such a manner, if a small number of cells failed, the counting is completed rapidly. If a large number of cells failed, the counting takes a longer time. More information can be found in United States Patent Publication 2008/0126676, incorporated herein by reference in its entirety. In another alternative, each of the sense amplifiers can output an analog voltage or current if its corresponding memory cell has failed and an analog voltage or current summing circuit can be used to count the number of memory cells that have failed. In one embodiment, there is one total counted, which reflects the total number of memory cells currently being programmed that have failed the last verify step. In another embodiment, separate counts are kept for each data state.

In step 508, it is determined whether the count from step 506 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 510. In this situation, enough memory cells programmed correctly such that the few remaining memory cells that have not been completely programmed can be corrected using ECC during the read process. In some embodiments, step 506 will count the number of failed cells for each sector, each target data state or other unit, and those counts will individually or collectively be compared to a threshold in step 508. In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed, temperature or other criteria.

If the number of failed cells is not less than the predetermined limit, than the programming process continues at step 512 and the program counter PC is checked against an Upper Limit value. Examples of an Upper Limit value are 20 or 26; however, other values can be used. If the program counter PC is not less than the Upper Limit value, then the program process is considered to have failed and a status of FAIL is reported in step 514. If the program counter PC is less than the Upper Limit value, then the process continues at step 516 during which time the Program Counter PC is incremented by 1 and the program voltage Vpgm is stepped up to the next magnitude. For example, the next pulse will have a magnitude greater than the previous pulse by a step size (e.g., a step size of 0.1-0.7 volts). After step 516, the process loops back to step 806 and another program pulse is applied to the selected word line.

During verify operations (e.g., step 504) and read operations, the selected word line is connected to a voltage, a level of which is specified for each read operation (e.g., Vra, Vrb, and Vrc,) or verify operation (e.g. Vva, Vvb, and Vvc) in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line voltage. The voltage on the bit line is measured after a period of time to see whether it has been discharged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287; (2) United States Patent Application Pub No. 2004/0109357; (3) U.S. Patent Application Pub. No. 2005/0169082; and (4) U.S. Patent Application Pub. No. 2006/0221692. The erase, read and verify operations described above are performed according to techniques known in the art. Thus, many of the details explained can be varied by one skilled in the art. Other erase, read and verify techniques known in the art can also be used.

As discussed above, FIG. 7 shows an embodiment which uses dummy select gates 190 connected to dummy selection line SGDU. FIGS. 14A-D are tables that describe the various voltages used in order to program, verify and/or read the select gates on the drain side of the NAND strings for the embodiment of FIG. 7.

FIG. 14A is a table that identifies that voltages used for programming dummy select gates and verifying (or reading) dummy select gates. The voltages depicted in the table of FIG. 14A for programming dummy select gates are applied during step 502 of FIG. 13, when the process of FIG. 13 is used to implement step 306 of FIG. 9 or step 452 of FIG. 12. In this embodiment, when applying the program pulse (step 502), the bit line receives 0 volts for those dummy select gates being programmed and Vdd for those select gates not being programmed. Selection line SGDU receives Vpgm (the program pulse), SGD0 receives Vpass (e.g., 7-10 volts), SGD1 receives Vpass, all the word lines (WL) receive Vpass, SGS receives 0 volts, CLSRC0 receives 1 volt and CLSRC1 receives 1 volt.

The rightmost column of the table depicted in FIG. 14A describes the voltages applied during a verify or read operation. The verify operation is performed during step 504 of FIG. 13, when the process of FIG. 13 is used to implement step 306 of FIG. 9 or step 454 of FIG. 12. The bit line will receive Vsense (e.g., 0.2 volts-0.8 volts), SGDU receives 1 volt, SGD0 receives Vread (e.g., 7-10 volts), SGD1 receives Vread, all the word lines (WL) receive Vread, SGS receives Vread, CLSRC0 receives 0 volts and CLSRC1 receives 0 volts. Programming the dummy select gates (using non-volatile programming so that the programming will remain even if power is removed) allows a connected bit line to be cut off when necessary by applying the appropriate voltage to SGDU. In one embodiment, the dummy select gates are programmed to have a threshold voltage of 1 volt. By applying 0 volts on SGDU, all the bit lines are cut off from all the NAND strings. This allows the select gates connected to SGD0 to be programmed while the bit lines are cut off. When performing such programming of the select gates connected to SGD0, while the bit lines are cut off, charge for the programming is obtained from the cell source line (CLSRC0 or CLSRC1).

FIG. 14B is a table providing the voltage values for programming the select gates connected to SGD0. The voltages for programming are applied during step 502 of FIG. 13, when FIG. 13 is used to implement step 308 of FIG. 9 or step 456 of FIG. 12. The bit line (VBL) receives Vdd (e.g., 2.5-3 volts), SGDU receives 0 volts (to cut off the bit line), SGD0 receives the program voltage VPGM, SGD1 and all the word lines (WL) receive Vpass, SGS receives VSGD (e.g. 2-3 volts), CLSRC0 receives 0 volts and CLSRC1 receives Vdd. When verifying or reading select gates connected to SGD0, the bit line will receive Vsense (e.g., 0.3 volts), SGDU receives Vread, SGD0 receives 1 volt, SGD1 receives Vread, the word lines WL receive Vread, SGS receives Vread, CLSRC0 receives 0 volts and CLSRC1 can float or be connected to Vsense. In one embodiment, only those select gates connected to SGD0 and CLSRC0 will be programmed.

FIG. 14C is a table describing programming, verifying and reading of select gates connected to SGD1. In the embodiment of FIG. 14C, the programming of select gates connected to SGD1 is performed using charge from the cell source line (CLSRC1). The programming voltages depicted in FIG. 14C are applied during step 502 of FIG. 13, when the process of FIG. 13 is used to implement step 310 of FIG. 9 or step 458 of FIG. 12. The bit line receives Vdd, SGDU receives 0V, SGD0 receives Vpass, SGD1 receives VPGM, the word lines WL receive Vpass, SGSS receives VSGD, CLSRC0 receives Vdd, CLSRC1 receives 0 volts. In one embodiment, when programming a subset of select gates connected to SGD1, those select gates that are connected to both SGD1 and CLSRC1 will be programmed. When verifying a reading select gates connected to SGD1, the bit line will receive Vsense, SGDU receives Vread, SGD0 receives 0 volts, SGD1 receives 1 volt, word lines WL receive Vread, SGSS receives Vread, CLSRC0 is connected to 0V and CLSRC1 is connected to 0 volts.

FIG. 14D is an alternative to FIG. 14C and includes programming the select gates connected to SGD1 using standard Fowler-Nordheim tunneling in a similar manner as the data non-volatile storage elements. The programming voltages depicted in FIG. 14D are applied during step 502 of FIG. 13, when the process of FIG. 13 is used to implement step 310 of FIG. 9 or step 458 of FIG. 12. The bit line voltage VBL will be 0 volts for those select gates being programmed and Vdd for those select gates not being programmed. SGDU receives Vpass, SGD0 receives 0V, SGD1 receives VPGM (the program pulse), the word lines WL receives Vpass, SGSS receives 0 volts, CLSRC0 receives 1 volt and CLSRC1 receives 1 volt. When verifying or reading, the bit line voltage VBL is set at Vsense, SGDU receives Vread, SGD0 receives 0 volts, SGD1 receives 1 volt, the word lines WL receive Vread, SGS receives Vread, CLSRC0 receives 0V, and CLSRC1 receives 0 volts.

FIGS. 15A-D are tables that describe another embodiment for programming, verifying and reading select gates for some embodiments that do not include dummy select gates. In these embodiments, the programming of at least a subset of the select gates connected to SGD0 is performed using hot carrier injection, and the programming of at least a subset of the select gates connected to SGD1 is performed using Fowler-Nordheim tunneling. For hot carrier injection, the system needs a large Vds to generate hot carriers. Vds can be supplied from the bit line, but is limited by sense amplifier head room. A larger Vds can alternatively be provided from the source line (e.g., CLSRC0).

FIG. 15A is a table describing one embodiment for programming select gates connected to SGD0 using hot carrier injection. The bit line will receive a bit line voltage VBL of, for example, 3 volts; SGD0 receives, for example, 5 volts; SGD1 receives Vpass; the word lines WL receive Vpass; SGS receives Vpass; CLSRC0 receives 0 volts and CLSRC1 is floated. When verifying a reading, the bit line receives Vsense, SGD0 receives 1 volt, SGD1 receives Vread, the word lines WL receive Vread, SGSS receives Vread, CLSRC0 receives 0 volts and CLSRC1 can float or receive Vsense.

FIG. 15B is a table describing an alternative embodiment for programming SGD0 using hot carrier injection. The bit line voltage VBL is 0 volts, SGD0 receives 8 volts, SGD1 receives Vpass, the word lines WL receive Vpass, SGSS receives Vpass, CLSRC0 receives 5 volts, and CLSRC1 is floated. When reading or verifying select gates connected to SGD0 in this embodiment, the bit line receives Vsense, SGD0 receives 1 volt, SGD1 receives Vread, the word lines WL receive Vread, SGSS receives Vread, CLSRC0 receives 0 volts and CLSRC1 can float or receive Vsense.

The table of FIG. 15C describes programming select gates connected to SGD1 using Fowler-Nordheim tunneling. The bit line receives Vdd, SGD0 receives 0V, SGD1 receives Vpgm, the word lines WL receive Vpass, SGS receives VSGD, CLSRC0 receives Vdd and CLSRC1 receives 0 volts. When reading or verifying select gates connected to SGD1, the bit line receives Vsense, SGD0 receives 0 volts, SGD1 receives 1 volt, the word lines receives Vread, SGSS receives Vread, CLSRC0 receives 0V, and CLSRC1 receives 0 volts.

FIG. 15D is another embodiment for programming select gates connected to SGD1 using Fowler-Nordheim tunneling. The bit line receives 0 volts for those select gates being programmed and Vdd for select gates not being programmed. SGD0 receives VSGD, SGD1 receives VPGM, the word lines WL receive Vpass, SGS receives 0 volts, CLSRC0 receives 1 volt and CLSRC1 receives 1 volt. When reading or verifying select gates connected to SGD1, the bit line receives Vsense, SGD0 receives 0 volts, SGD1 receives 1 volt, the word lines WL receive Vread, SGS receives Vread, CLSRC0 receives Vsense or is floated and CLSRC1 receives 0 volts.

The voltages for programming listed in FIGS. 15A and 15B are applied during step 502 of FIG. 13, when the process of FIG. 13 is used to implement step 308 of FIG. 9 or step 456 of FIG. 12. The verify and read voltages of FIGS. 15A and 15B are applied during step 504 of FIG. 13, when the process of FIG. 13 is used to implement step 308 of FIG. 9 and step 456 of FIG. 12. The voltages for programming listed in FIGS. 15C and 15D are applied during step 502 of FIG. 13, when the process of FIG. 13 is used to implement step 310 of FIG. 9 or step 458 of FIG. 12. The voltages listed in FIGS. 15C and 15D for verifying and reading are applied during step 504 of FIG. 13, when the process of FIG. 13 is used to implement step 310 of FIG. 9 or step 458 of FIG. 12.

Figures 16A, 16B:
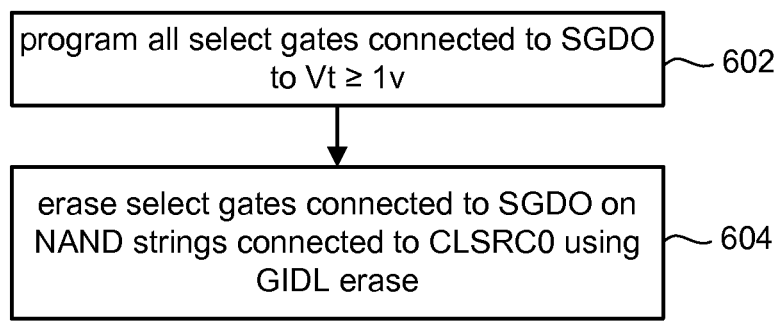
FIG. 16A is a flow chart describing one embodiment of a process for programming select gates.
FIG. 16B is a table indicating voltages used to erase select gates.

Another embodiment for programming select gates, described by FIGS. 16A and 16B, include programming all of the select gates connected to SGD0 to a particular threshold voltage, and then erasing a subset of those select gates using a Gate Induced Drain Leakage (GIDL) erase process, with the programming of at least a subset of the select gates connected to SG1 being performed using Fowler-Nordheim tunneling. Using GIDL, hole injection is implemented to erase the transistors. Thus, there is an assumption that transistors to be erased have an initial threshold voltage greater than or equal to 1 volt. GIDL is generated at the edge of the boosting potential.

In step 602 of FIG. 16A, all of the select gates connected to SGD0 are programmed to a threshold voltage greater than or equal to 1 volt. In step 604, a subset of the select gates connected to SGD0 are erased using a GIDL erase process. In one embodiment, the subset of select gates that are erased are those select gates that are part of NAND strings connected to CLSRC0. The process of FIG. 16A is performed as part of step 308 of FIG. 9 or 456 of FIG. 12. Step 602 of FIG. 16A can be performed using the process of FIG. 13. In one embodiment, the erase process of step 604 can also be performed using the process of FIG. 13, where step 502 applies erase pulses (as discussed above) and step 504 verifies whether the threshold voltage of the erase non-volatile storage element has been lowered to the target level or whether or not the erase pulse needs to be applied. In such a case, Table 16B depicts the voltages used to provide the erase pulse during step 502 and the voltage used to perform the verification of step 504. Applying the erase pulse includes applying 0 volts to the bit line, -2 volts to SGD0, Vpgm to SDG1, Vpass to the word lines WL, Vsgd to SGS, 0 volts to CLSRC0 and Vdd to CLSRC1. Verifying or reading the select gates includes applying Vsense to the bit line, 0 volts to SGD0, Vread to SGD1, Vread to the word lines WL, Vread to SGS, 0 volts to CLSRC0 and float or apply Vsense to CLSRC1. When programming the select gates connected to SGD0 using the processes described by FIGS. 16A and 16B, the select gates connected to SGD1 can be programmed and verified/read using the tables of FIGS. 15C and 15D, which includes performing Fowler-Nordheim tunneling using the processes of FIG. 13 implementing steps 310 of FIGS. 9 and 456 of FIG. 12.

As discussed above, to program the data non-volatile storage elements (connected to WL0, WL1, ... WLY), the system will perform the process of FIG. 13 to implement step 404 of FIG. 11 or step 460 of FIG. 12. FIG. 17 shows the voltages applied to program data non-volatile storage elements that are in NAND strings connected to CLSRC0 based on FIG. 4. The voltages for programming listed in FIG. 17 are applied during step 502 of FIG. 13. Note that those NAND strings connected to CLSRC0 include (in one embodiment) a select gate connected to SGD0 that had its threshold voltage programmed to 1 volt. The bit line will receive 0 volts during step 502, SGD0 receives Vsgd, SGD1 receives 0 volts, the selected word line for programming (the word line connected to the data non-volatile storage element being programmed) receives Vpgm (the program pulse), the unselected word lines receive Vpass, SGSS receives 0V, CLSRC0 receives 1v, CLSRC1 receives 1v, and SDGU (for those embodiments that have the dummy select gates) receives Vpass. When verifying (or reading) the bit line will receive Vsense (step 504 of FIG. 13), SGD0 receives Vsg (ie ~3-7v), SGD1 receives 0 volts, the selected word line WLN receives VCG (the read compare voltage), the unselected word lines receive Vread, SGS receives Vsg, CLSRC0 receives 0 volts, CLSRC1 receives 0V and SGDU (for those embodiments that have a dummy select gate) receive Vread.

FIG. 18 is a table listing voltages applied during step 502 and 504 of FIG. 13 when the process of FIG. 13 is used to implement steps 404 of FIGS. 11 and 460 of FIG. 12. The voltages listed in FIG. 18 are used when programming, verifying or reading data non-volatile storage elements on NAND strings connected to CLSRC1 and whose select gates connected to SGD1 have their threshold voltage programmed to 1 volt (or other suitable level). When programming (step 502), the bit line receives 0 volts, SGD0 receives 0 volts, SGD1 receives Vsgd, a selected word line WLN receives Vpgm (the program pulse), the unselected word lines receive Vpass, SGS receives 0V, CLSRC0 receives 0V, CLSRC1 receives 1V and SGDU (for those embodiments that include a dummy select gate) receives Vpass. When verifying a reading (step 504), the bit line receives Vsense, SGD0 receives 0 volts, SGD1 receives the Vsg, the selected word line WLN receives VCG, the unselected word lines receive Vread, SGS receives Vsg, CLSRC0 receives 0V, CLSRC1 receives 0 volts and SGDU (for those embodiments that include dummy select gate) receives Vread. The voltages listed in the tables of FIGS. 17 and 18 provide for programming and reading the group/NAND strings of data non-volatile storage elements based on the non-volatile programming of the select gates described herein. Note that the voltages listed in FIGS. 14-18 are applied by the one or more managing circuits described above.

One embodiment includes a method of operating a non-volatile storage. With respect to multiple groups of non-volatile storage elements that each comprise multiple connected data non-volatile storage elements and multiple select gates on a common side of the data non-volatile storage elements, the method comprises performing non-volatile programming of at least one of the select gates for each group to allow independent selection of the groups from another group connected to a common bit line.

One embodiment includes a non-volatile storage apparatus, comprising a plurality of non-volatile storage elements arranged into groups of connected non-volatile storage elements. Each group comprises multiple connected data non-volatile storage elements and multiple select gates on a common side of the data non-volatile storage elements. The apparatus further comprises a plurality of bit lines, each of the bit lines are connected to multiple groups; a plurality of word lines, each of the word lines are connected to multiple groups; and one or more managing circuits in communication with the non-volatile storage elements via the bit lines and word lines. The one or more managing circuits perform non-volatile programming of at least one of the select gates for each group to allow independent selection of the groups from another group connected to a common bit line.

One embodiment includes a non-volatile storage apparatus, comprising: a first bit line; a plurality of word lines; a first selection line; a second selection line; a first NAND string connected to the first bit line, the first NAND string includes a plurality of non-volatile storage elements, a first selection gate and a second selection gate, the first selection gate is in communication with the first bit line and connected to the first selection line, the second selection gate is connected to the first selection gate and the second selection line, the second selection gate is connected to one of the non-volatile storage elements of the first NAND string; a second NAND string connected to the first bit line, the second NAND string includes a plurality of non-volatile storage elements, a third selection gate and a fourth selection gate, the word lines are connected to the first NAND string and the second NAND string, the third selection gate is in communication with the first bit line and connected to the first selection line, the fourth selection gate is connected to the third selection gate and the second selection line, the fourth selection gate is also connected to one of the non-volatile storage elements of the second NAND string; and one or more managing circuits in communication with the bit lines and word lines, the one or more managing circuits perform non-volatile programming of the first select gate and the fourth select gate to allow independent selection of either the first NAND string being in communication with the first bit line or the second NAND string being in communication with the first bit line.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method of operating a non-volatile storage, comprising:
with respect to multiple groups of non-volatile storage elements that each comprise multiple connected data non-volatile storage elements and multiple select gates on a common side of the data non-volatile storage elements, performing non-volatile programming of at least one of the select gates for each group to allow independent selection of the groups from another group connected to a common bit line, wherein each of the groups further includes at least one dummy select gate and at least one connected dummy select line, the performing non-volatile programming comprises programming dummy select gates using the connected dummy select line to allow a connected bit line to be cut off, and programming at least one subset of the select gates for each group is performed while the bit line is cut off.

2. The method of claim 1, further comprising:
programming and reading the groups of non-volatile storage elements based on the non-volatile programming.

3. The method of claim 1, wherein:
a first select gate for each group is connected to a first select line;
a second select gate for each group is connected to a second select line;
the non-volatile programming comprises programming at least a subset of the first select gates and programming at least a subset of the second select gates.

4. The method of claim 3, wherein:
the programming of at least the subset of the first select gates is performed using hot carrier injection and the programming of at least the subset of the second select gates is performed using Fowler-Nordheim tunneling.

5. The method of claim 3, wherein:
the programming of at least the subset of the first select gates is performed by programming all of the first select gates and then erasing some of the first select gates using a GIDL erase process; and
the programming of at least the subset of the second select gates is performed using Fowler-Nordheim tunneling.

6. The method of claim 3, wherein:
a charge for programming the subset of the first select gate is obtained from a cell source line connected to a subset of the groups on a side opposite of the bit line.

7. The method of claim 3, wherein:
the non-volatile programming comprises erasing the first select gate and the second select gate for each group prior to programming at least the subset of the first select gates and programming at least the subset of the second select gates.

8. The method of claim 1, wherein:
charge for programming the at least one of the select gates for each group is provided from a source line connected to a subset of the groups on a side opposite of the common bit line.

9. The method of claim 1, wherein:
the groups of non-volatile storage elements are NAND strings.

10. A non-volatile storage apparatus, comprising:
a plurality of non-volatile storage elements arranged into groups of connected non-volatile storage elements, each group comprises multiple connected data non-volatile storage elements and multiple select gates on a common side of the data non-volatile storage elements;
a plurality of bit lines, each of the bit lines are connected to multiple groups;
a plurality of word lines, each of the word lines are connected to multiple groups;
one or more managing circuits in communication with the non-volatile storage elements via the bit lines and word lines, the one or more managing circuits perform non-volatile programming of at least one of the select gates for each group to allow independent selection of the groups from another group connected to a common bit line;
a first selection line connected to first select gates for the groups; and
a second selection line connected to second select gates for the groups, the one or more managing circuits perform non-volatile programming of at least one of the select gates for each group by programming all of the first select gates and then erasing some of the first select gates using a GIDL erase process and programming at least a subset of the second select gates using Fowler-Nordheim tunneling.

11. The non-volatile storage apparatus according to claim 10, wherein:
the one or more managing circuits read and program the non-volatile storage elements based on the non-volatile programming.

12. The non-volatile storage apparatus according to claim 10, further comprising:
a first source line connected to a first subset of the groups; and
a second source line connected to a second subset of the groups, none of the groups in the first subset are also in the second subset, the first source line is not in communication with the second source line.

13. The non-volatile storage apparatus according to claim 12, wherein:
adjacent pairs of the groups are connected to other adjacent pairs of the groups in a neighboring block of non-volatile storage elements to form connected sets of four groups, every other connected set of four groups is connected to the first source line with intervening connected sets of four groups being connected to the second source line.

14. The non-volatile storage apparatus according to claim 12, wherein:
every other one of the groups is connected to a corresponding other one of the groups in a neighboring block of non-volatile storage elements and to the first source line, intervening groups are connected to the second source line.

15. The non-volatile storage apparatus according to claim 10, further comprising:
a first source line; and
a second source line that is separate from the first source line, a first subset of the groups are connected to the first source line, a second subset of the groups are connected to the second source line, the first subset of the groups and the second subset of the groups have no group in common.

16. The non-volatile storage apparatus according to claim 10, further comprising:
a first selection line connected to first select gates for the groups; and
a second selection line connected to second select gates for the groups, the one or more managing circuits perform non-volatile programming of at least one of the select gates for each group by programming at least a subset of the first select gates using hot carrier injection and programming of at least the subset of the second select gates using Fowler-Nordheim tunneling.

17. The non-volatile storage apparatus according to claim 16, wherein:
the one or more managing circuits erase the first select gates and the second select gates before programming at least the subset of the first select gates and programming of at least the subset of the second select gates.

18. The non-volatile storage apparatus according to claim 10, further comprising:
a first selection line connected to first select gates for the groups;
a second selection line connected to second select gates for the groups;
a dummy selection line connected to dummy select gates for the groups, the one or more managing circuits perform non-volatile programming of at least one of the select gates for each group by programming dummy select gates to allow a respective connected bit line to be cut off and programming a subset of the first select gates while the respective connected bit line is cut off and charge for programming the subset of the first select gate is obtained from a cell source line connected to a subset of the groups on a side opposite of the bit line.

19. The non-volatile storage apparatus of claim 10, wherein:
the groups of connected non-volatile storage elements are NAND strings.

20. A non-volatile storage apparatus, comprising:
a first bit line;
a plurality of word lines;
a first selection line;
a second selection line;
a first NAND string connected to the first bit line, the first NAND string includes a plurality of non-volatile storage elements, a first selection gate and a second selection gate, the first selection gate is in communication with the first bit line and connected to the first selection line, the second selection gate is connected to the first selection gate and the second selection line, the second selection gate is connected to one of the non-volatile storage elements of the first NAND string;
a second NAND string connected to the first bit line, the second NAND string includes a plurality of non-volatile storage elements, a third selection gate and a fourth selection gate, the word lines are connected to the first NAND string and the second NAND string, the third selection gate is in communication with the first bit line and connected to the first selection line, the fourth selection gate is connected to the third selection gate and the second selection line, the fourth selection gate is also connected to one of the non-volatile storage elements of the second NAND string; and
one or more managing circuits in communication with the bit lines and word lines, the one or more managing circuits perform non-volatile programming of the first select gate and the fourth select gate to allow independent selection of either the first NAND string being in communication with the first bit line or the second NAND string being in communication with the first bit line, wherein
the one or more one or more managing circuits perform non-volatile programming of the first select gate by first programming the first select gate and subsequently erasing the first select gate using a GIDL erase process.

21. The non-volatile storage apparatus of claim 20, wherein:
the one or more one or more managing circuits perform non-volatile programming of the first select gate using hot carrier injection; and
the one or more one or more managing circuits perform non-volatile programming of the fourth select gate using Fowler-Nordheim tunneling.

22. The non-volatile storage apparatus of claim 20, wherein:
the first select gate is connected to one of a first source line and a second source line, the second source line different than the first source line; and
the one or more one or more managing circuits perform non-volatile programming of the fourth select gate using Fowler-Nordheim tunneling.

23. The non-volatile storage apparatus of claim 20, further comprising:

a dummy selection line, the first NAND string includes a first dummy select gate connected to the dummy selection line and the first bit line, the second NAND string includes a second dummy select gate connected to the dummy selection line and the first bit line, the one or more managing circuits program the first dummy select gate and the second dummy select gate to allow the first bit line to be cut off, the one or more managing circuits program perform non-volatile programming of at least the first select gate while the first bit line is cut off.

* * * * *